United States Patent
Utsunomiya

(10) Patent No.: US 7,514,306 B2
(45) Date of Patent: Apr. 7, 2009

(54) METHOD FOR MANUFACTURING SEMICONDUCTOR DEVICE

(75) Inventor: Sumio Utsunomiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 134 days.

(21) Appl. No.: 11/683,023

(22) Filed: Mar. 7, 2007

(65) Prior Publication Data

US 2007/0232034 A1 Oct. 4, 2007

(30) Foreign Application Priority Data

Mar. 28, 2006 (JP) ............................. 2006-088292

(51) Int. Cl.
*H01L 21/00* (2006.01)
*H01L 21/84* (2006.01)

(52) U.S. Cl. ........................ 438/166; 438/486; 438/909; 257/E21.113

(58) Field of Classification Search ................ 438/166, 438/486, 909, FOR. 269; 257/E21.113; 117/7, 117/8, 906
See application file for complete search history.

(56) References Cited

U.S. PATENT DOCUMENTS 3,870,472 A * 3/1975 Adamski et al. ............... 117/3
2002/0153360 A1* 10/2002 Yamazaki et al. ...... 219/121.66
2005/0019997 A1* 1/2005 Kusumoto et al. .......... 438/166
2006/0134347 A1* 6/2006 Chiruvolu et al. ........... 427/585
2007/0111450 A1* 5/2007 Sato et al. ................... 438/264
2007/0202319 A1* 8/2007 Bryan et al. ................. 428/323

FOREIGN PATENT DOCUMENTS

JP   A 09-156916   6/1997
JP   A 09-293687   11/1997

* cited by examiner

*Primary Examiner*—George Fourson
*Assistant Examiner*—John M Parker
(74) *Attorney, Agent, or Firm*—Oliff & Berridge, PLC

(57) ABSTRACT

A method for manufacturing a semiconductor device, includes:
a) spraying a combusted gas onto a member containing a metal element, the combusted gas being obtained by combusting a mixed gas that at least includes a gas containing a hydrogen atom and an oxygen gas;
b) spraying the combusted gas onto the amorphous semiconductor film placed on a substrate having an insulating surface thereof; and
c) adding the metal element to at least a vicinity of a surface of the amorphous semiconductor film to enhance re-crystallization of a semiconductor.

10 Claims, 5 Drawing Sheets

METHOD FOR MANUFACTURING SEMICONDUCTOR DEVICE

BACKGROUND OF THE INVENTION

1. Technical Field

Several aspects of the present invention relate to a method for manufacturing a semiconductor thin film and a semiconductor device using the semiconductor thin film.

2. Related Art

In displays of forming images using a thin film transistor (hereinafter referred to as a "TFT") as the switching element, such as liquid crystal displays, achieving higher performance of TFT is demanded.

Higher performance can be achieved by what has been referred to as a polysilicon TFT, which uses polycrystalline silicon for the active layer.

For the purpose of reducing cost of displays, a method of recrystallizing (modifying) an amorphous silicon layer deposited on a low-cost glass substrate at temperatures equal to or less than the strain point of the glass substrate is generally used.

JP-A-9-293687, a first example of related art, discloses a laser annealing method where an amorphous silicon layer is melt and re-crystallized by laser annealing as a technique of recrystallizing an amorphous silicon layer at low temperature.

JP-A-9-156916, a second example of related art, discloses a method where a metal element is added onto an amorphous silicon layer to decrease the temperature required for re-crystallization by a chemical vapor deposition (CVD) apparatus using electrodes made of a material containing a metal element to facilitate crystallization of silicon.

However, the above-mentioned two methods involve the following problems.

In the former, cost reduction is difficult because laser oscillators are expensive.

In the latter, achieving higher performance of TFT is difficult, not only because the device is expensive but also because a metal element remaining in the recrystallized silicon film decreases mobility in a silicon film.

SUMMARY

A method for manufacturing a semiconductor device according to one aspect of the invention includes adding a metal element to enhance recrystallization of a semiconductor to at least a vicinity of a surface of an amorphous semiconductor film by spraying a combusted gas onto a member containing the metal element and then onto the amorphous semiconductor film placed on a substrate having an insulating surface thereof, the combusted gas being obtained by combustion of a mixed gas, the mixed gas at least including a gas containing a hydrogen atom and an oxygen gas.

According to the above-mentioned method, the combusted gas comes to contain the above-mentioned metal element in the form of hydroxide by being sprayed onto the above-mentioned member.

The hydroxide is dissolved into water vapor, and is carried along the flow of the water vapor to the surface of an amorphous semiconductor film.

As a result, a metal element to enhance crystallization of a semiconductor is added to at least the vicinity of the surface of the above-mentioned amorphous semiconductor film to reduce the temperature and heating time required to modify (crystallize) the amorphous semiconductor film into a polycrystalline semiconductor film by heating.

This manufacturing method therefore enables formation of a polycrystalline semiconductor film on a substrate made of a material having a low strain point such as glass, allowing formation of a semiconductor device on a large-area substrate at low cost.

The method for manufacturing a semiconductor device according to one aspect of the invention is a method for manufacturing a semiconductor device including the above-mentioned first step, the method further including, after the above-mentioned first step, a second step for modifying the above-mentioned amorphous semiconductor film to be a polycrystalline semiconductor film by heating the above-mentioned amorphous semiconductor film with the above-mentioned metal element added.

In the above-mentioned first step, a flame is sprayed onto an amorphous semiconductor film, and therefore modification into a polycrystalline semiconductor film slightly proceeds.

However, addition of a metal element differs from modification into a polycrystalline semiconductor film in terms of required conditions such as the temperature of a flame.

Therefore, by performing separately the step for modifying an amorphous semiconductor film into a polycrystalline semiconductor film by heating as the second step, the step for adding a metal element and the step for modifying an amorphous semiconductor film can each be practiced under the optimum conditions.

Preferably, the above-mentioned mixed gas is a gas having a hydrogen gas and an oxygen gas mixed with a ratio of nearly two to one.

This structure causes most components of the combusted gas obtained by combustion of the above-mentioned mixed gas to become water vapor, allowing efficient addition of a metal element.

Therefore, the amount of the above-mentioned mixed gas supplied can be reduced, thereby controlling the temperature increase of the above-mentioned substrate and the substrate deformation due to the temperature increase.

Preferably, the above-mentioned metal element is nickel.

Nickel has a particularly high effect to enhance crystallization of a semiconductor.

Therefore, this structure can reduce the temperature in crystallizing the above-mentioned amorphous semiconductor film, thereby controlling the temperature increase of the above-mentioned substrate and the substrate deformation due to the temperature increase.

Preferably, the above-mentioned member is net-shaped.

Making the above-mentioned member net-shaped allows a combusted gas to be sprayed through the net-shaped member onto an amorphous semiconductor film.

The net-shaped member allows increase of the contact area between the combusted gas and the above-mentioned member without blocking the flow of the combusted gas.

This manufacturing method thus allows efficient addition of a metal element to an amorphous semiconductor film, and further allows formation of a large-area polycrystalline semiconductor film at low cost.

Preferably, the above-mentioned second step is a step for spraying a combusted gas onto the above-mentioned amorphous semiconductor film.

The above-mentioned first step is a step for spraying a combusted gas onto an amorphous semiconductor film.

This manufacturing method enables the above-mentioned first and second steps to be continuously performed using the same or a similar device.

As a result, a large-area polycrystalline semiconductor film can be obtained at low cost.

Preferably, the above-mentioned manufacturing method further includes a third step for forming a semiconductor oxide film containing the above-mentioned metal element by oxidizing the surface of the polycrystalline semiconductor film with the above-mentioned metal element added; and a fourth step for selectively removing the above-mentioned semiconductor oxide film.

The above-mentioned metal element facilitates modification of an amorphous semiconductor film to a polycrystalline semiconductor film; however, manufacturing a semiconductor device using a polycrystalline semiconductor film obtained by the modification has adverse effects such as decreased mobility.

The above-mentioned metal element remains in the modified polycrystalline semiconductor film, and the remaining concentration increases as the location approaches the surface of the film.

On the other hand, a semiconductor oxide film can be selectively etched with respect to the polycrystalline semiconductor film.

Accordingly, the surface of the modified polycrystalline semiconductor film is oxidized to form a semiconductor oxide film, and thereafter the semiconductor oxide film is selectively etched, allowing a polycrystalline semiconductor film containing the above-mentioned metal element to a lesser extent to be left on the substrate.

This manufacturing method thus enables formation of a semiconductor device with high performance and reliability on a large-area substrate at low cost.

Preferably, the above-mentioned third step is a step for spraying a combusted gas onto the above-mentioned amorphous semiconductor film.

The above-mentioned first step is a step for spraying a combusted gas onto an amorphous semiconductor film, and the above-mentioned second step is practicable by spraying a combusted gas onto an amorphous semiconductor film.

This manufacturing method enables the above-mentioned first and third steps or the above-mentioned first to third steps to be continuously performed using the same or a similar device.

As a result, a large-area polycrystalline semiconductor film can be obtained at low cost.

Preferably, the above-mentioned combusted gas is a gas obtained by combusting a hydrogen gas and an oxygen gas mixed with a ratio of the oxygen gas to the hydrogen gas greater than one half.

Combusting a gas having a hydrogen gas and an oxygen gas mixed with the above ratio generates oxygen radical simultaneously with water vapor, causing improved oxidation rate.

This manufacturing method therefore allows surface oxidation of the above-mentioned polycrystalline semiconductor film at further lower temperature for a short time period, and allows distortion of the above-mentioned substrate to be controlled.

Preferably, the direction of spraying the above-mentioned combusted gas is substantially identical to the gravitational direction.

This manufacturing method allows the above-mentioned combusted gas to be sprayed with a substrate having an amorphous semiconductor film formed thereon mounted on a plane surface.

As compared to a manner of spraying a combusted gas from another direction, a mechanism for holding and transferring a substrate can be simplified, allowing formation of a large-area polycrystalline semiconductor film at further low cost.

Preferably, the above-mentioned combusted gas is sprayed substantially evenly within a long square having a length in the longitudinal direction greater than a width of the substrate on a surface perpendicular to the spraying direction, the above-mentioned substrate being located on the surface, the substrate and the combusted gas moving relatively to each other at constant speed.

This manufacturing method allows scanning of the substrate surface at constant speed with a combusted gas distributing in a curtain shape, thereby spraying the combusted gas evenly over the entire surface of the substrate.

This therefore allows formation of a further even polycrystalline semiconductor film on a large-area substrate.

Preferably, the above-mentioned semiconductor is silicon.

A semiconductor device using silicon, which is generally used as a device for driving of a display, can be formed on a large-area substrate at low cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments in which the invention is practiced will be described below.

The embodiments of the invention are characterized in that a combusted gas (hereinafter referred to as a "flame") obtained by combusting a mixed gas is sprayed on a substrate.

Figure 1:
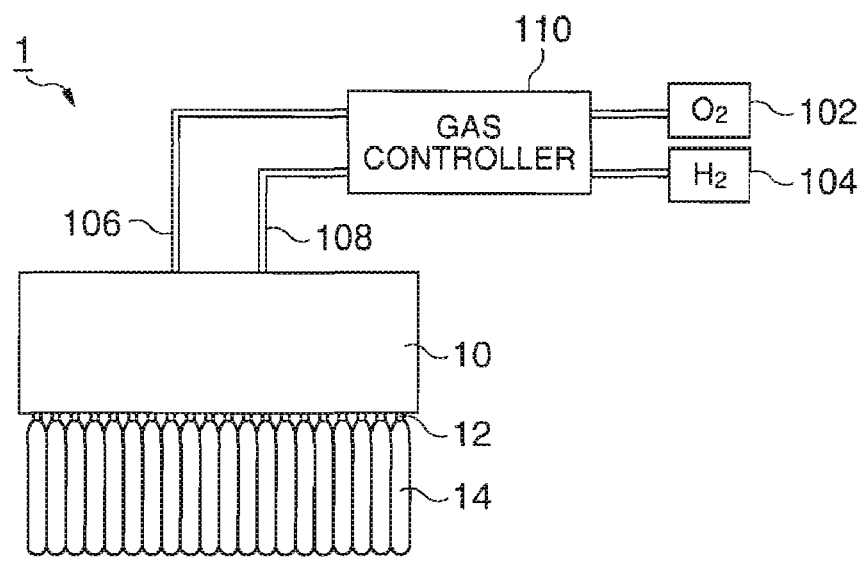
FIG. 1 is a diagram showing a gas burner used in embodiments.
Figure 2:
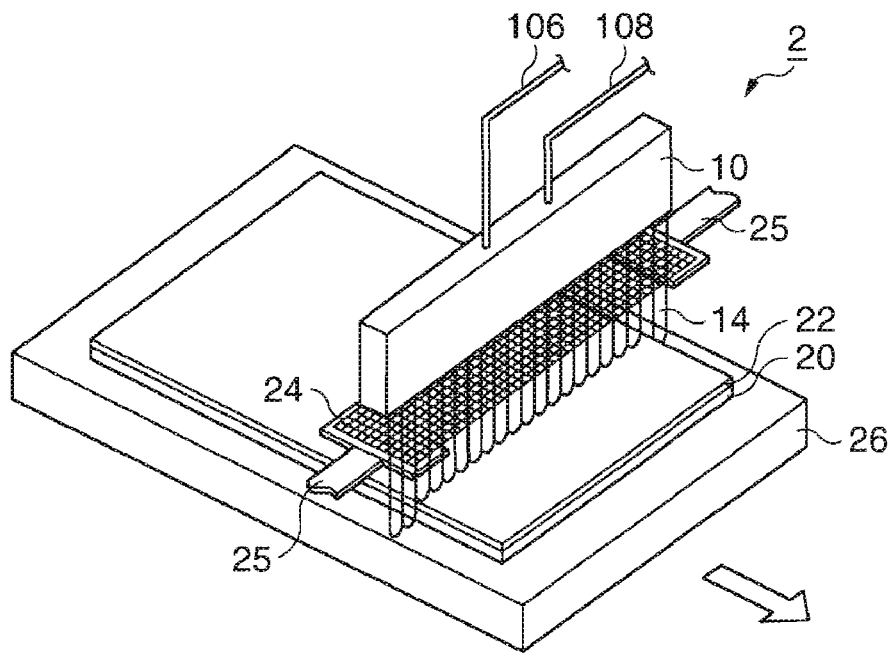
FIG. 2 is a diagram showing the outline of a heating device using the gas burner.

Referring to FIGS. 1 and 2, the outline of a gas burner used in the embodiments, and the outline of a heating device including the gas burner, a holding base that holds a substrate, and the like will now be described.

FIG. 1 is a diagram showing the outline of a gas burner used in the embodiments.

A gas burner 1 includes an enclosure 10, a first gas supply source 102 that supplies an oxygen gas, a second gas supply source 104 that supplies a hydrogen gas, a first pipe 106 that introduces the oxygen gas into the enclosure 10, a second pipe 108 that introduces the hydrogen gas into the enclosure 10, and a gas controller 110 that can adjust the gas weight flow.

The enclosure 10 includes, in the inside thereof, an igniter, which is not shown, and a combustion chamber, which is not shown, for combusting a mixed gas of hydrogen and oxygen.

A plurality of nozzles 12 are also included that blow off flames obtained by combusting the mixed gas in one direction.

The shapes of the nozzles 12 are identical, so that the shapes of flames blown off from the nozzles 12 are substantially identical to one another.

Placing nozzles 12 lineally at regular intervals therefore allows the flames to make the shape of a curtain, that is, the shape of a long square on a plane surface perpendicular to the direction of the flame blown off.

The gas controller 110 can arbitrarily adjust the shape and temperature of a flame 14 by adjusting the gas weight flow.

By changing the flow ratio between hydrogen gas and oxygen gas, the flame 14 can be composed of water vapor and an oxygen gas (specifically radicalized oxygen atoms), for example, instead of water vapor alone.

Connecting three or more gas supply sources and combusting a gas other than a hydrogen gas can also be used.

FIG. 2 is a diagram showing the outline of a heating device using the above-described gas burner.

The heating device 2 includes the gas burner 1, a metal member 24, which is produced by forming in a net shape a member made of metal that enhances crystallization of a semiconductor, (hereinafter referred to as a "net"), a net holder 25 that can hold the net 24 between the nozzles 12 and the substrate 20, and a substrate holding base 26 movable in the arrow direction at constant speed while holding the substrate 20 having an amorphous silicon film 22, as an amorphous semiconductor film, formed on the surface thereof.

If a mixed gas is combusted while the net 24 is held, the flame 14 is sprayed through the net 24 onto the amorphous silicon film 22 formed on the surface of the substrate 20.

By passing through the net 24, the flame 14 is sprayed onto the net 24 made of metal that enhances crystallization of a semiconductor, and then onto the amorphous semiconductor film 22.

Note that some components such as the gas controller 110 are omitted in FIG. 2.

As shown, the width of the gas burner 1 (the length in the direction perpendicular to the arrow direction or the gravitational direction in the drawing) is sufficiently larger than that of the substrate 20, so that the flames 14 can be sprayed evenly in the width direction of the substrate 20.

Moving the substrate holding base 26, which holds the substrate 20 at constant speed, enables the flames 14 to be sprayed evenly onto the entire surface of the substrate 20.

While only one gas burner 1 is shown in FIG. 2, a plurality of gas burners 1 may be provided in the arrow direction, allowing the flame 14 to be sprayed a plurality of times per movement of the substrate 20.

Without the net 24, the flame 14 may also be sprayed onto the amorphous semiconductor film 22 not through the net 24 by moving the substrate 20.

Embodiments in which the invention is practiced will now be described with reference to the accompanying drawings.

In the embodiments described later, silicon is used as a semiconductor, and nickel is used as a metal element to facilitate crystallization of silicon as the semiconductor.

First Embodiment

FIGS. 3A to 3C, 4 and 5 are diagrams showing a first embodiment of the invention.

The diagrams show a manner in which an amorphous silicon film formed on the substrate made of glass such as barium borosilicate glass or aluminoborosilicate glass (hereinafter referred to as "substrate") is crystallized to be modified into a polycrystalline silicon film.

Figure 3A:
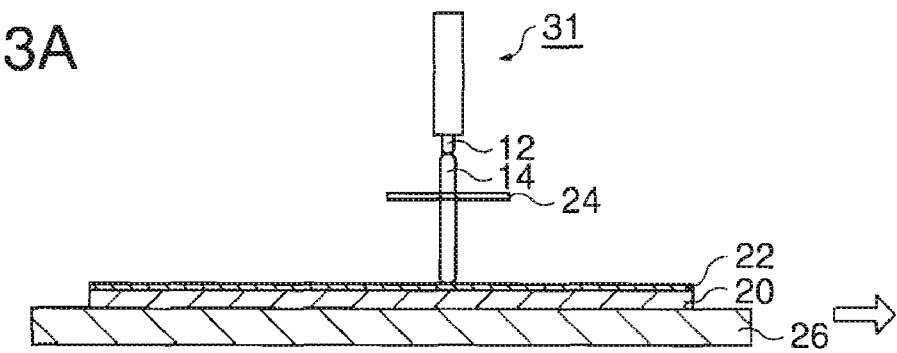
FIGS. 3A to 3C are diagrams showing a first embodiment of the invention.

FIG. 3A is a diagram showing a manner of a first step, that is, a step for adding a metal element that facilitates crystallization of a semiconductor to the vicinity of the surface of an amorphous semiconductor film.

The substrate 20 having the amorphous silicon film 22 formed on the surface thereof is held on the substrate holding base 26 that moves in the direction of arrow in the diagram at constant speed.

A first gas burner 31 is provided above the substrate holding base 26.

A hydrogen gas and an oxygen gas are supplied from a gas supply source, which is not shown, through a pipe, which is not shown, to the first gas burner 31, and are combusted inside the enclosure 10 to be converted into water vapor.

The net 24 made of nickel is provided between the first gas burner 31 and the substrate holding base 26.

The flame 14 blown off downwards (in the gravitational direction) from the nozzle 12 by combustion impinges on the net 24, and then is sprayed onto the amorphous silicon film 22.

When the flame 14 is sprayed, nickel is converted into nickel hydroxide through reaction represented by the following formula (1).

$$Ni + 2H_2O \rightarrow Ni(OH)_2 + H_2 \qquad (1)$$

Nickel hydroxide is dissolved in water vapor contained in the flame 14, and is carried to the surface of the amorphous silicon film 22 and is added to the surface.

Here, the above-mentioned nickel hydroxide is not implanted into the amorphous silicon film 22 in such a manner as ion implantation method, and therefore does not deeply penetrate into the inside of the amorphous silicon film 22.

Accordingly, the nickel element is distributed such that its concentration is high at the surface of the amorphous silicon film 22 and dramatically decreases as the location moves inwards (in the direction towards the interface with the substrate 20).

The addition of nickel hydroxide causes the amorphous silicon film 22 in a state where crystallization proceeds easily and hence the film is modified into a polycrystalline silicon film 28 in the following second step (refer to FIG. 3B).

In FIG. 3A, one first gas burner 31 and one net 24 are provided; however, embodiments of the first step are not limited to this manner.

The plurality of nets 24 may be provided for each gas burner 1 such that they are placed one atop another or apart from one another.

The plurality of first gas burners 31 may be placed in parallel such that the flame 14 is sprayed onto the substrate 20 a plurality of times.

However, the number of gas burners and the temperature of the substrate 20 naturally affect the temperature of the flame 14, and the movement speed of the substrate holding base 26 also affects the temperature of the substrate 20 during operation.

Accordingly, the setting conditions depend on heat resistance of the substrate 20.

Corning 7059 glass used for liquid crystal displays and the like, for example, has a strain point of 593 degrees Celsius, and therefore preferably has a maximum temperature of 550 degrees Celsius or less, and more preferably a maximum temperature of 500 degrees Celsius or less.

The number of gas burners is therefore preferably set within the range of temperatures of the substrate 20 not more than 500 degrees Celsius to add nickel element efficiently.

While the first step is a step for adding nickel element to the amorphous silicon film 22, performing either or both of a second and a third step, which will be described later, without using the flame 14 is one of embodiments of the invention.

As described above, addition of nickel element to the amorphous silicon film 22 causes the film to have properties of crystallizing at lower temperatures than the film without anything added.

The film is thus crystallized at more lower temperature or for a more shorter time, if means generally used in semiconductor device manufacturing processes such as heating using a diffusion furnace, lamp annealing, laser annealing or the like is used.

Hence, combining the above-described first step with conventional methods can form the polycrystalline silicon film 28 of a large area on a glass substrate at low cost.

Figure 3B:
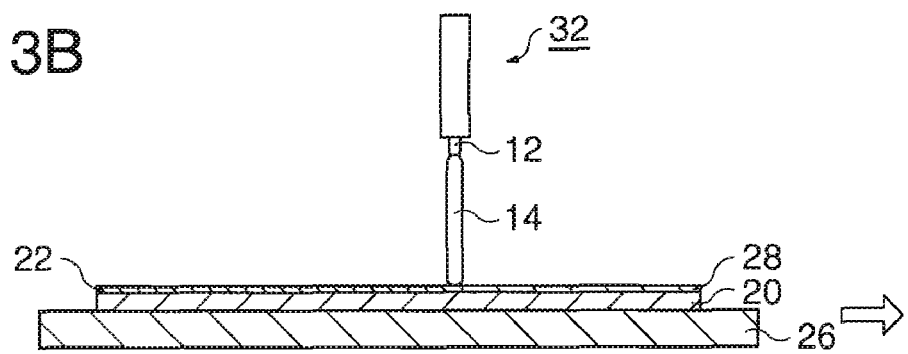

FIG. 3B is a diagram showing a manner of the second step, that is, a step for heating the amorphous silicon film 22 with nickel element added to modify the film into the polycrystalline silicon film 28.

Similarly to the first step, the substrate 20 is held on the substrate holding base 26 that moves in the direction of arrow in the diagram at constant speed, and a second first gas burner 32 is provided above the substrate holding base 26.

The flame 14 blown off from the second gas burner 32 heats the amorphous silicon film 22 with nickel element added, which is formed on the substrate 20.

Different from the first step, no net 24 is provided.

As described above, nickel element is added such that its concentration is high at the surface of the amorphous silicon film 22, and therefore modification of the surface starts at low temperature.

Once part of the film is crystallized to grow a crystal grain, crystallization proceeds using the crystal grain as a seed crystal even at lower temperatures than those causing beginning crystallization.

The amorphous silicon film 22 is therefore polycrystallized up to the inside where the concentration of nickel element is low, that is, the interface with the substrate 20, and thus is modified into the polycrystalline silicon film 28.

In addition, the temperature of the flame 14 heating the substrate 20 depends on a glass strain point, just as in the first step.

Figure 3C:
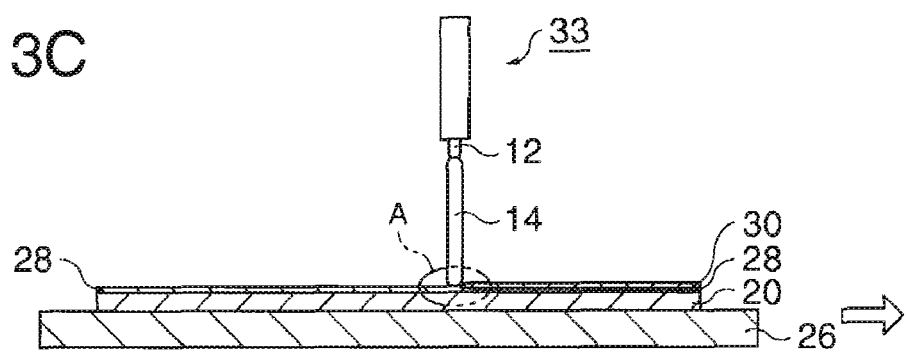
Figure 5:
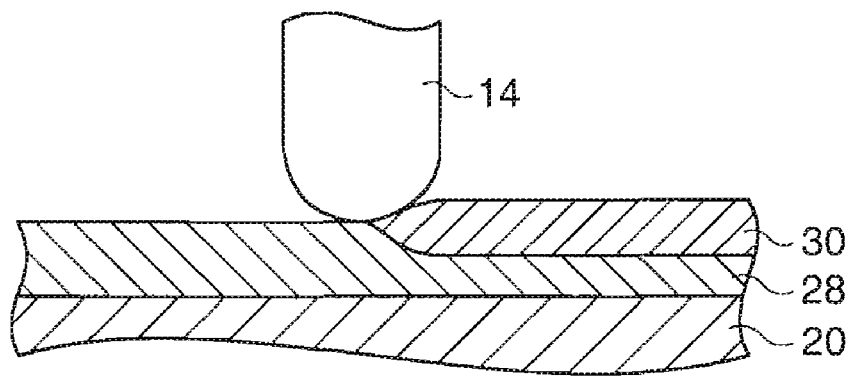
FIG. 5 is a diagram showing the first embodiment of the invention.

FIGS. 3C and 5 are diagrams showing a manner of the third step, that is, a step of heating the polycrystalline silicon film 28, which is obtained by modification, using the flame 14 to form an oxide film 30 at the surface of the polycrystalline silicon film 28.

Similarly to the first and second steps, the substrate 20 is held on the substrate holding base 26 that moves in the direction of arrow in the diagram at constant speed, and a third gas burner 33 is provided above the substrate holding base 26.

The flame 14 blown off from the nozzle 12 heats the polycrystalline silicon film 28 formed on the substrate 20, oxidizing the film from the surface to a predetermined depth to form the oxide film 30 that takes in the remaining nickel element.

An enlarged diagram of the inside of a circle indicated by A in FIG. 3C is FIG. 5.

The polycrystalline silicon film 28 is oxidized from the surface to a predetermined depth by water vapor and oxygen radical constituting the flame 14 to become the oxide film 30 containing nickel element.

The polycrystalline silicon film 28 having a thickness less than that when formed remains underneath the oxide film 30.

Since nickel element added to the amorphous silicon film 22 functions as a catalyst to enhance crystallization of silicon, the nickel element remains in the modified polycrystalline silicon film 28.

Particularly in the vicinity of the surface of the film, the remaining nickel element has a high concentration.

However, the nickel element remaining in the polycrystalline silicon film 28 has adverse effects such as decreased mobility as described above.

Therefore, the polycrystalline silicon film 28 is initially formed on the substrate 20 in such a manner to have a film thickness equal to or larger than that required for forming a semiconductor device.

The oxide film 30 that takes in the remaining nickel element described above is then formed.

By selectively removing the oxide film 30 thereafter, the polycrystalline silicon film 28 that has the remaining nickel concentration within the acceptable range is obtained.

Figure 4:
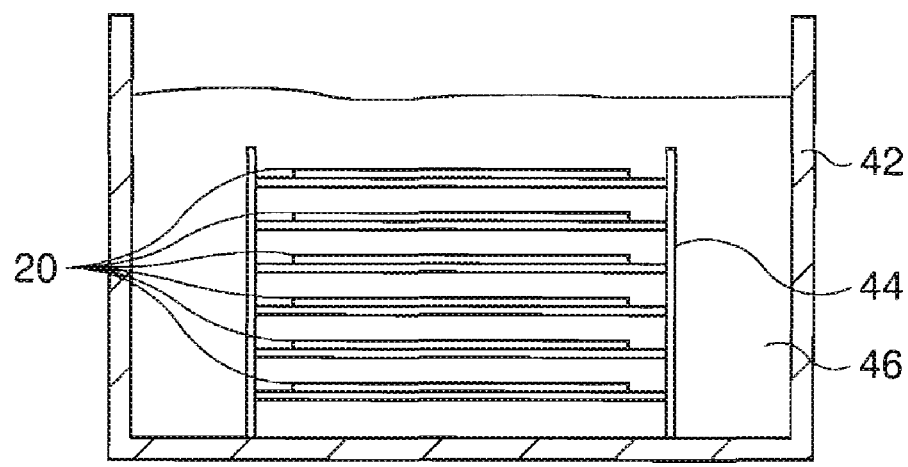
FIG. 4 is a diagram showing the first embodiment of the invention.

FIG. 4 is a diagram showing a manner of a fourth step, that is, a step for selectively removing the oxide film 30 to expose the polycrystalline silicon film 28 underneath the oxide film 30.

Hydrofluoric acid or an etchant 46 having hydrofluoric acid as its major component is injected into a liquid bath 42.

The substrate 20 held by a carrier 44 made of Teflon (registered trademark) is immersed in the liquid bath 42, so that the oxide film 30 at the surface is selectively etched and removed.

Thereafter, water washing and drying are performed thereby to obtain the polycrystalline silicon film 28 of a large area on the surface of the substrate 20.

Next, required film thicknesses of the polycrystalline silicon film 28 and the oxide film 30 will be described.

A concentration of about $1 \times 10^{18}$ cm−3 or more is needed for nickel element to effectively decrease the temperature required for crystallization of silicon.

If heat treatment is performed for t seconds with a layer containing nickel element of this concentration existing in the surface layer, nickel diffuses in the film thickness direction of the polycrystalline silicon film.

The concentration distribution at that time can be calculated by the following equation (2).

$$C/Co = 1 - erf(x/(2 \times (Dt)^{0.5})) \qquad (2)$$

where Co is a concentration of the surface layer, X is a distance from the surface, and D is a diffusion coefficient of nickel at the heat treatment temperature.

At a temperature of 500 degrees Celsius, the diffusion coefficient of nickel in silicon is about $3.5 \times 10^{-14}$ cm$^2 \times$s$^{-1}$.

On the other hand, given that the concentration of nickel acceptable in silicon that is an active layer of a transistor is $1 \times 10^{-15}$ cm−3 (less than 1 ppm), $C/Co < 1 \times 10^{-3}$ is required.

Based on these factors, the distance from the surface of the polycrystalline silicon film that has a concentration equal to or less than the acceptable concentration is estimated to be about 50 nm, for example, if heat treatment time is 30 seconds.

Accordingly, the nickel concentration of the remaining polycrystalline silicon film can be suppressed to be equal to or less than the acceptable value by applying heat treatment for 30 seconds and selectively removing, after oxidizing, the surface layer at least to a thickness of 50 nm.

For example, a polycrystalline silicon film is deposited to a thickness of 100 nm and the surface layer of 50 nm is oxidized and then removed, whereby the remaining film of 50 nm can be obtained as a high-purity polycrystalline silicon film.

Second Embodiment

Next, a second embodiment of the invention will be described with reference to FIG. 6.

This drawing is a diagram showing the state of the heating device 2 seen from the direction perpendicular to the moving direction of the substrate 20 as well as the gravitational direction, similarly to the first embodiment.

Figure 6:
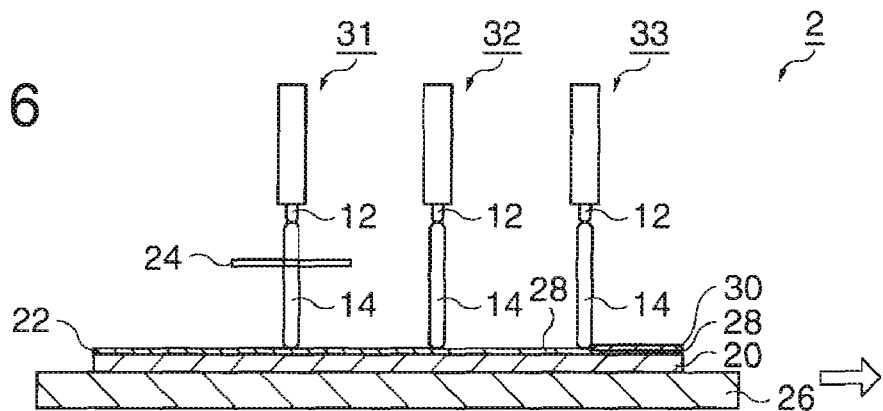
FIG. 6 is a diagram showing a second embodiment of the invention.

As shown in FIG. 6, the first gas burner 31, the second gas burner 32 and the third gas burner 33 are placed in this order in the heating device 2.

The net 24 made of nickel is placed between the first gas burner 31 and the substrate holding base 26.

The steps of gas burners are the same as those in the first embodiment.

Therefore, the first step for adding nickel element to the amorphous silicon film 22, the second step for crystallizing the amorphous silicon film 22 to obtain the polycrystalline silicon film 28, and the third step for oxidizing part that contains high concentration nickel element of the surface layer of the polycrystalline silicon film 28 to form the oxide film 30 can be carried out by transferring the substrate 20 one time.

The step and device for etching and removing the oxide film 30 formed in the third step are needed separately.

By the method used in the first embodiment of immersing the substrate 20 in the etchant 46 filled in the liquid bath 42, the oxide film 30 is removed, allowing the polycrystalline silicon film 28 of a large area to be formed on the surface of the substrate 20.

The layout of the three kinds of gas burners mentioned above is not limited to that at the same height as shown, but can be set according to the need for each step.

The number of gas burners is not limited to one for each step, but a plurality of gas burners can be used for one step.

The height and the number of the foregoing gas burners can therefore be set freely unless the temperature of the substrate 20 exceeds the glass strain point, efficiently obtaining the polycrystalline silicon film 28 of a large area.

Third Embodiment

Next, the third embodiment of the invention will be described with reference to FIG. 7.

This drawing is a diagram showing the state of the heating device 2 seen from the direction perpendicular to the moving direction of the substrate 20 as well as the gravitational direction, similarly to the first embodiment.

Figure 7:
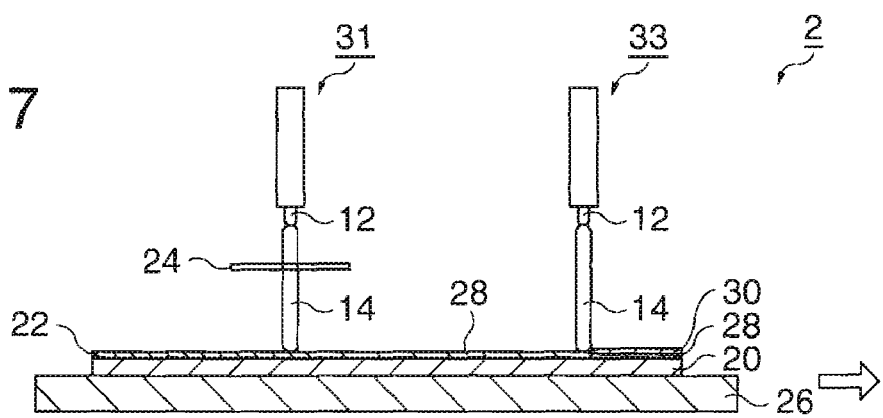
FIG. 7 is a diagram showing a third embodiment of the invention.

As shown in FIG. 7, the first gas burner 31 and the third gas burner 33 are placed in this order in the heating device 2.

The net 24 made of nickel is placed between the first gas burner 31 and the substrate holding base 26.

The second gas burner 32 for performing recrystallization is not provided.

By using the first gas burner 31, the first step for adding nickel element to the amorphous silicon film 22 and the second step for modifying (crystallizing) the amorphous silicon film 22 to form the polycrystalline silicon film 28 are performed simultaneously.

The first step and the second step are different from each other in terms of the presence of the net 24, but are identical to each other in terms of heating the amorphous silicon film 22 by using the flame 14.

The amorphous silicon film 22 starts recrystallization even during addition of nickel element, if the surface temperature and the amount of nickel element added to the surface meet predetermined requirements.

Therefore, by determining the amount of nickel element added in consideration of the shape of the net 24, the number of nets 24 to be placed one atop another and the like and setting the temperature of the flame 14 and the like appropriate, the amorphous silicon film 22 can be recrystallized while receiving addition of nickel element.

In addition, a step for selectively etching and removing the oxide film 30 formed in the third step needs be performed separately, which is the same as in the second embodiment.

Fourth Embodiment

Next, the fourth embodiment of the invention will be described with reference to FIG. 8.

This drawing is a diagram showing the state of the heating device 2 seen from the direction perpendicular to the moving direction of the substrate 20 as well as the gravitational direction, similarly to the first embodiment.

Figure 8:
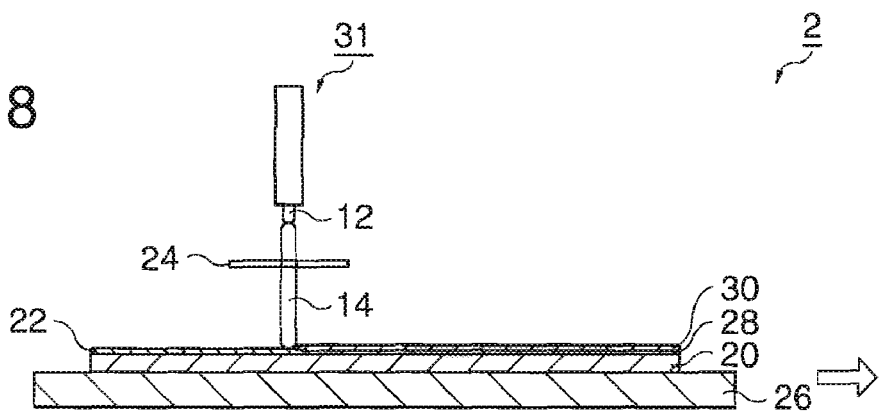
FIG. 8 is a diagram showing a fourth embodiment of the invention.

As shown in FIG. 8, only the first gas burner 31 and the net 24 are placed in the heating device 2.

By using the first gas burner 31, the first to third steps are performed simultaneously.

Similarly to the first and second steps, the third step is a step for heating by blowing off the flame 14 to the substrate 20.

Polycrystallization of the amorphous silicon film 22 and oxidation of the surface of the polycrystalline silicon film 28 obtained by polycrystallization have a commonality in terms of heating.

Once started, polycrystallization of the amorphous silicon film 22 proceeds not so much depending on an oxide film formed on the surface. In other words, regarding the amorphous silicon film 22, recrystallization towards the interface with the substrate 20 is compatible with oxidation of the surface.

Therefore, by appropriately selecting the shape of the net 24 made of nickel, the number of nets 24 to be placed one atop another and the like, and the temperature of the flame 14 and the like, and further the film thickness of the amorphous silicon film 22 formed on the substrate, the polycrystalline silicon film 28 having a film thickness required for forming a semiconductor device and having a nickel element concentration within the acceptable range can be formed on the top surface of the substrate 20 using a single gas burner.

In addition, a step for etching and removing the oxide film 30 formed on the polycrystalline silicon film 28 needs be performed separately, which is the same as in the third embodiment.

Semiconductor Device

Next, a method of manufacturing a TFT as a semiconductor device will be described with reference to FIGS. 9A to 9D.

Figure 9A:
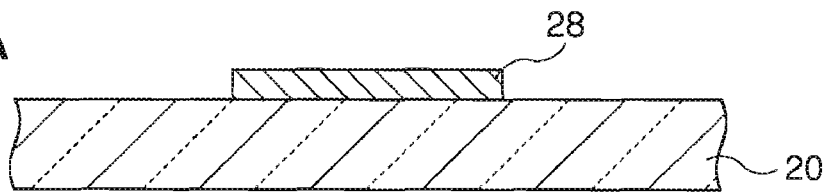
FIGS. 9A to 9D are diagrams showing a method for manufacturing a semiconductor device.
Figure 9B:
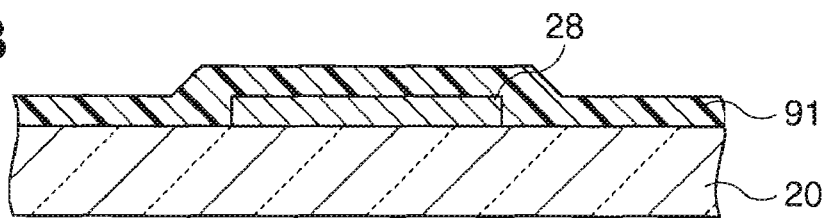

Initially, as shown in FIG. 9A, the polycrystalline silicon film 28 formed on the substrate 20 according to one of the above-described embodiments is patterned, so that a TFT element region (island-shaped region) is formed. Next, as shown in FIG. 9B, a gate insulating film 91 is formed.

For example, by a CVD method using tetraethylorthosilicate (TEOS) as the raw material, a silicon oxide film is formed to be the gate insulating film 91.

Figure 9C:
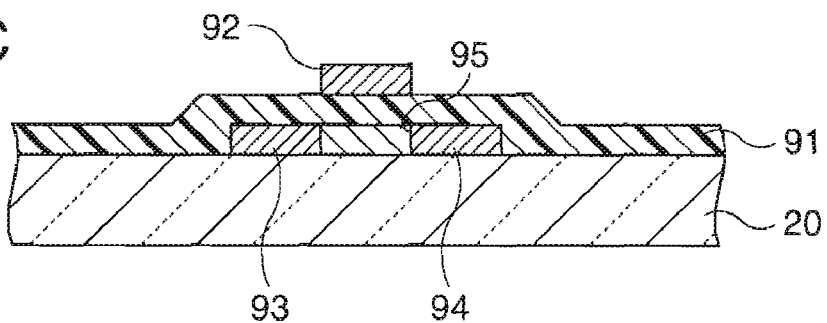

Next, as shown in FIG. 9C, a metal thin film made of aluminum or the like, is formed over the entire surface of the substrate 20 by a sputtering method and then is patterned, thereby forming a gate electrode 92 above a channel region 95.

Using the gate electrode 92 as a mask, impurities of high concentration are implanted into the TFT element region by an ion implantation method, thereby forming a source region 93 and a drain region 94.

Figure 9D:
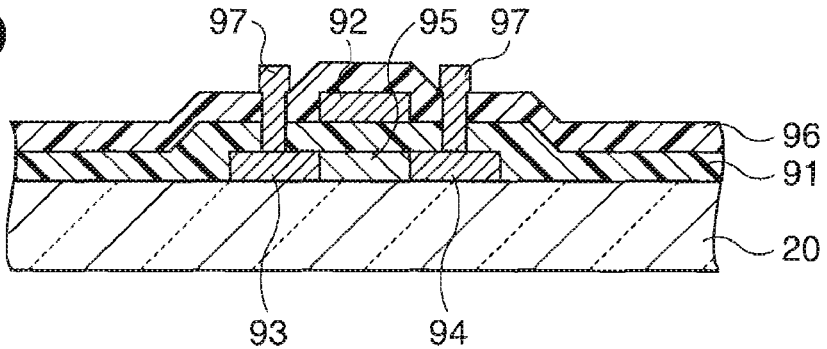

Finally, as shown in FIG. 9D, electrodes are formed. Specifically, a silicon oxide film is formed on the top surface of a TFT element region, forming an interlayer insulating film 96.

Next, contact holes are opened in the interlayer insulating film 96 above the source region 93 and the drain region 94.

An aluminum layer is formed over the entire surface of the substrate 20 by a sputtering method and the like, and thereafter is patterned, thereby forming the electrodes 97.

This allows the TFT element to be electrically connected to outer circuits or other TFT elements.

The above-mentioned aluminum layer may be formed after a conductive material has been embedded into the contact holes.

First Modification

While a substrate made of barium borosilicate glass, aluminoborosilicate glass or the like is used in the above-described embodiments, the invention is applicable to substrates made of quartz glass and the like which are highly resistant to heat.

In this case, a polycrystalline silicon film can be formed using a relatively low cost device, allowing control of manufacturing cost, which is the same as in the above-described embodiments.

Second Modification

While an amorphous silicon film is used as a starting point to obtain a polycrystalline silicon film, a microcrystalline silicon film can be used instead of an amorphous silicon film.

As in the case of using an amorphous silicon film, effects such as improvement of mobility can be obtained by recrystallizing the microcrystalline silicon film to be a polycrystalline silicon film.

Third Modification

While a flame is sprayed onto an amorphous silicon film through a net made of nickel in the above-described embodiments, nozzles of a gas burner used in the first step may be made of nickel.

This makes it possible to add nickel without using a net or to improve efficiency of nickel addition by using the nozzles together with the net.

Fourth Modification

While nozzles are formed in a line in the above-described embodiments, the nozzles may be placed in two or more lines, or in a staggered fashion.

The nozzles may also be formed in the shape of a long slit.

This increases the density of the flame, leading to improved efficiency of nickel addition, efficiency of oxidation and the like.

What is claimed is:

1. A method for manufacturing a semiconductor device, comprising:
    a) spraying a combusted gas onto a member containing a metal element, the combusted gas being obtained by combusting a mixed gas that at least includes a gas containing a hydrogen atom and an oxygen gas;
    b) spraying the combusted gas onto the amorphous semiconductor film placed on a substrate having an insulating surface thereof; and
    c) adding the metal element to at least a vicinity of a surface of the amorphous semiconductor film to enhance re-crystallization of a semiconductor.

2. The method for manufacturing a semiconductor device according to claim 1, further comprising:
    d) modifying the amorphous semiconductor film into a polycrystalline semiconductor film by heating the amorphous semiconductor film with the metal element added.

3. The method for manufacturing a semiconductor device according to claim 1, wherein the metal element is nickel.

4. The method for manufacturing a semiconductor device according to claim 1, wherein the member is net-shaped.

5. The method for manufacturing a semiconductor device according to claim 2, wherein the step d) includes; spraying a combusted gas onto the amorphous semiconductor film.

6. The method for manufacturing a semiconductor device according to claim 2, further comprising:
    e) forming a semiconductor oxide film containing the metal element by oxidizing a surface of the polycrystalline semiconductor film with the metal element added; and
    f) selectively removing the semiconductor oxide film.

7. The method for manufacturing a semiconductor device according to claim 6, wherein the step e) includes; spraying a combusted gas onto the amorphous semiconductor film.

8. The method for manufacturing a semiconductor device according to claim 1, wherein a direction of spraying the combusted gas is substantially identical to a gravitational direction.

9. The method for manufacturing a semiconductor device according to claim 1, wherein the combusted gas is sprayed substantially evenly within a long square having a length in a longitudinal direction greater than a width of the substrate on a surface perpendicular to a spraying direction, the substrate being located on the surface, the substrate and the combusted gas moving relatively to each other at constant speed.

10. The method for manufacturing a semiconductor device according to claim 1, wherein the semiconductor is silicon.

* * * * *